US008008915B2

(12) United States Patent
Ookawa

(10) Patent No.: US 8,008,915 B2
(45) Date of Patent: Aug. 30, 2011

(54) MAGNETIC RESONANCE IMAGING APPARATUS AND MAGNETIC RESONANCE IMAGING METHOD

(75) Inventor: Masashi Ookawa, Otawara (JP)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 239 days.

(21) Appl. No.: 12/343,564

(22) Filed: Dec. 24, 2008

(65) Prior Publication Data

US 2009/0212772 A1 Aug. 27, 2009

(30) Foreign Application Priority Data

Dec. 28, 2007 (JP) ................................. 2007-339897
Nov. 10, 2008 (JP) ................................. 2008-287885

(51) Int. Cl.
*G01V 3/00* (2006.01)
(52) U.S. Cl. ........................................ 324/307; 324/309
(58) Field of Classification Search .......... 324/300–322; 600/407–445
See application file for complete search history.

(56) References Cited

U.S. PATENT DOCUMENTS

| 5,235,281 | A | * | 8/1993 | Haragashira et al. | 324/318 |
| 5,652,515 | A | * | 7/1997 | Kondo | 324/309 |
| 5,928,146 | A | * | 7/1999 | Itagaki et al. | 600/410 |
| 6,567,685 | B2 | * | 5/2003 | Takamori et al. | 600/410 |
| 6,906,515 | B2 | * | 6/2005 | Yatsui et al. | 324/309 |
| 7,418,286 | B2 | * | 8/2008 | Kumai et al. | 600/410 |
| 2008/0089570 | A1 | * | 4/2008 | Weng et al. | 382/131 |
| 2008/0161678 | A1 | * | 7/2008 | Miyazaki et al. | 600/419 |

FOREIGN PATENT DOCUMENTS

| JP | 08-336506 | 12/1996 |
| JP | 2005-270303 | 10/2005 |

* cited by examiner

*Primary Examiner* — Brij B Shrivastav
(74) *Attorney, Agent, or Firm* — Nixon & Vanderhye PC

(57) ABSTRACT

A magnetic resonance imaging apparatus includes a data acquisition unit and an image generating unit. The data acquisition unit acquires echo signals by echo planar imaging which generates the echo signals by applying plural phase-encoding gradient magnetic field pulses and by repeatedly inverting a readout gradient magnetic field after one nuclear magnetic resonance (NMR) excitation. Each of the plural phase-encoding gradient magnetic field pulses has an intensity set so as to compensate an influence of spatially distributed eddy currents to each of the spatial imaging positions. The image generating unit generates MRI data and an image based on the acquired echo signals.

21 Claims, 11 Drawing Sheets

| APPLICATION AXIS | INFLUENCED AXIS | COEFFICIENT OF APPROXIMATE EXPRESSION | TIME CONSTANT | SCALING FACTOR |
|---|---|---|---|---|
| X | X | $a_{xx1}$ $b_{xx1}$ $c_{xx1}$ | $T_{xx1}$ | $Sc_{xx1}$ |
| | Y | $a_{xy1}$ $b_{xy1}$ $c_{xy1}$ | $T_{xy1}$ | $Sc_{xy1}$ |
| | Z | $a_{xz1}$ $b_{xz1}$ $c_{xz1}$ | $T_{xz1}$ | $Sc_{xz1}$ |
| Y | X | $a_{yx1}$ $b_{yx1}$ $c_{yx1}$ | $T_{yx1}$ | $Sc_{yx1}$ |
| | Y | $a_{yy1}$ $b_{yy1}$ $c_{yy1}$ | $T_{yy1}$ | $Sc_{yy1}$ |
| | Z | $a_{yz1}$ $b_{yz1}$ $c_{yz1}$ | $T_{yz1}$ | $Sc_{yz1}$ |
| Z | X | $a_{zx1}$ $b_{zx1}$ $c_{zx1}$ | $T_{zx1}$ | $Sc_{zx1}$ |
| | Y | $a_{zy1}$ $b_{zy1}$ $c_{zy1}$ | $T_{zy1}$ | $Sc_{zy1}$ |
| | Z | $a_{zz1}$ $b_{zz1}$ $c_{zz1}$ | $T_{zz1}$ | $Sc_{zz1}$ |
| X | X | $a_{xx2}$ $b_{xx2}$ $c_{xx2}$ | $T_{xx2}$ | $Sc_{xx2}$ |
| | Y | $a_{xy2}$ $b_{xy2}$ $c_{xy2}$ | $T_{xy2}$ | $Sc_{xy2}$ |
| | Z | $a_{xz2}$ $b_{xz2}$ $c_{xz2}$ | $T_{xz2}$ | $Sc_{xz2}$ |
| Y | X | $a_{yx2}$ $b_{yx2}$ $c_{yx2}$ | $T_{yx2}$ | $Sc_{yx2}$ |
| | Y | $a_{yy2}$ $b_{yy2}$ $c_{yy2}$ | $T_{yy2}$ | $Sc_{yy2}$ |
| | Z | $a_{yz2}$ $b_{yz2}$ $c_{yz2}$ | $T_{yz2}$ | $Sc_{yz2}$ |
| Z | X | $a_{zx2}$ $b_{zx2}$ $c_{zx2}$ | $T_{zx2}$ | $Sc_{zx2}$ |
| | Y | $a_{zy2}$ $b_{zy2}$ $c_{zy2}$ | $T_{zy2}$ | $Sc_{zy2}$ |
| | Z | $a_{zz2}$ $b_{zz2}$ $c_{zz2}$ | $T_{zz2}$ | $Sc_{zz2}$ |

FIG. 10

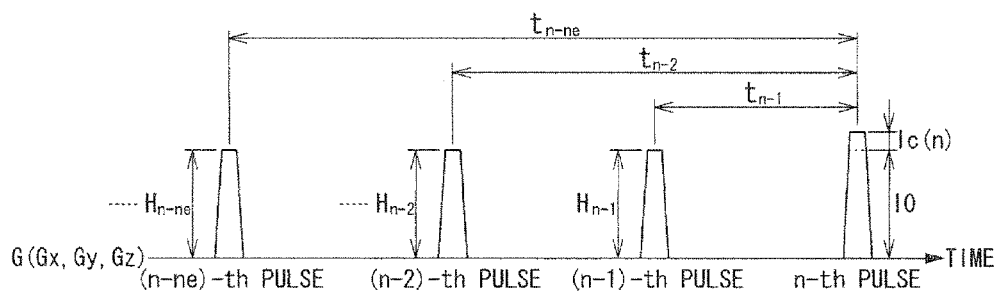

FIG. 11

MAGNETIC RESONANCE IMAGING APPARATUS AND MAGNETIC RESONANCE IMAGING METHOD

BACKGROUND OF THE INVENTION

1. Field of the Invention

The present invention relates to an MRI (magnetic resonance imaging) apparatus and an MRI method which excite nuclear spins of an object magnetically with a Larmor frequency RF (radio frequency) signal and reconstruct an image based on NMR (nuclear magnetic resonance) signals generated due to the excitation, and more particularly, to a magnetic resonance imaging apparatus and a magnetic resonance imaging method which generate image data by single shot echo planar imaging.

2. Description of the Related Art

Magnetic Resonance imaging is an imaging method which magnetically excites nuclear spins of an object set in a static magnetic field with a Larmor frequency RF signal and reconstructs an image based on MR signals generated due to the excitation.

In the field of magnetic resonance imaging, there is an imaging method called echo planar imaging (EPI) (see, for example, Japanese Patent Application Laid-Open disclosure No. 9-276243). EPI is one of the known high-speed imaging methods in MRI. EPI is an imaging method for performing a scan which repetitively inverts a gradient magnetic field with high speed after a single nuclear magnetic excitation so as to generate a repeating train of echoes. More specifically, in EPI, all the data necessary for image reconstruction are acquired with generating continuous repetitive gradient echoes using related concurrent steps of phase encodes (PE) before NMR magnetization in the x-y plane attenuates and disappears by transverse relaxation (T2 relaxation) after applying an excitation pulse (FLIP PULSE). EPI includes SE EPI using a spin echo (SE) method to acquire spin echo signals generated after an excitation pulse and a refocus pulse (FLOP PULSE) and FE EPI with using a field echo (FE) method to acquire echo signals generating after applying an excitation pulse. While EPI generating data for a single image combined with echo train data obtained by applying an excitation pulse plural times is called multi-shot EPI, EPI to reconstruct an image by applying only a single RF excitation pulse is called single shot (SS) EPI.

FIG. 1 is a diagram showing the conventional SS SE EPI sequence.

In FIG. 1, RF denotes RF excitation pulses, ECHO denotes echo signals, Gss denotes gradient magnetic fields for SS (slice selection), Gro denotes gradient magnetic fields for RO (readout) and Gpe denotes gradient magnetic fields for phase encode respectively.

As shown in FIG. 1, in a SS SE EPI sequence, a refocus pulse is applied with a gradient magnetic field pulse for slice selection subsequently to an excitation pulse. A gradient magnetic field pulse called TUNE for adjusting a moment of the gradient magnetic field is applied in an RO direction and a PE direction respectively between the excitation pulse and the refocus pulse. In addition, after applying the refocus pulse, a spoiler gradient magnetic field pulse for the refocus pulse is applied in a SS direction.

Next, a gradient magnetic field pulse in a PE direction called BLIP pulse is applied repeatedly and a phase encode amount depending on an intensity of each BLIP pulse is added sequentially. On the other hand, a gradient magnetic field in the RO direction of which polarity inverts alternately is applied repeatedly. Consequently, echo signals necessary for generating a set of image data generates continuously and the generated echo signals are acquired. That is, echo signals for generating a set of image data can be acquired by a single nuclear magnetic excitation.

Further, as an applied technology of EPI, a diffusion weighted image (DWI) is known. A DWI is an image derived by enhancing a phase shift due to a motion of an imaging target by applying a high-intensity gradient magnetic field called MPG (motion probing gradient) pulse so as to enhance diffusion effect of the imaging target.

FIG. 2 is a diagram showing the conventional SS SE EPI sequence with applying MPG pulses for DWI.

In FIG. 2, RF denotes RF excitation pulses, ECHO denotes echo signals, Gss denotes gradient magnetic fields in the SS direction, Gro denotes gradient magnetic fields in the RO direction and Gpe denotes gradient magnetic fields in the PE direction respectively.

In the case of acquiring a DWI, for example, as shown in FIG. 2, MPG pulses are applied after applying an excitation pulse and after applying a FLOP SPOILER pulse respectively. A DWI can be acquired by performing a SS SE EPI sequence with application of the MPG pulses as mentioned above.

However, in the conventional SS EPI, there is a problem that an image may be distorted under the influence of eddy currents at some imaging positions depending on characteristics of the hardware. That is, eddy currents having spatial distributions separately to an apparatus are generated due to factors such as a type of magnet, manufacturing error or how to wind a gradient magnetic field coil. For this reason, the influence of an eddy current is different between imaging sections of which positions are mutually different spatially, and therefore, inappropriate phase encode pulses may be applied on some imaging positions. When an image is reconstructed with using data acquired under the influence of an eddy current as mentioned above, the image is distorted and the quality of the image is reduced.

In addition, since s special distribution of an eddy current changes depending on an imaging position and an application pattern of a gradient magnetic field, there is a problem that deterioration of an image quality becomes prominent at an imaging position in case of calculating an isotropic image using plural application patterns of gradient magnetic fields with applications of particularly high-intensity MPG pulses like imaging of a DWI especially.

FIG. 3 is an example of DWIs, distorted due to influence of eddy currents, acquired by performing the conventional SS SE EPI sequence.

In FIG. 3, (a) is a DWI in case of setting the b value representing a DWI intensity in the DE direction to 1000, (b) is a DWI in case of setting the b value in the RO direction to 1000 and (c) is a DWI in case of setting the b value in the SS direction to 1000.

It is confirmed that a distortion amount of a DWI acquired with a high intensity of each MPG pulse in the RO direction and the SS direction shown in FIG. 3 (b) and FIG. 3 (c) respectively is larger than that of a DWI acquired with a high intensity of a MPG pulse in the PE direction shown in FIG. 3 (a). That is, it is recognized that a different amount of distortion occurs every image section under the influence of an eddy current having a spatial distribution.

As described above, since a spatial distribution of an eddy current is not assumed in the conventional SS EPI, a different distortion occurs in an image with depending on an imaging position and an application pattern of a gradient magnetic field.

SUMMARY OF THE INVENTION

The present invention has been made in light of the conventional situations, and it is an object of the present invention to provide a magnetic resonance imaging apparatus and a magnetic resonance imaging method which make it possible to reduce a distortion, of which amount varies depending on a spatial position of an imaging section, in an image occurring due to eddy currents.

The present invention provides a magnetic resonance imaging apparatus comprising: a data acquisition unit configured to acquire echo signals by echo planar imaging which generates the echo signals with correcting and applying plural gradient magnetic fields for phase encode and with continuously inverting a gradient magnetic field for readout after one nuclear magnetic excitation, the plural gradient magnetic fields for phase encode each having an intensity set so as to compensate an influence of an eddy current distributing spatially adaptively to each of imaging positions; and an image generating unit configured to generate image data based on the echo signals, in an aspect to achieve the object.

The present invention also provides a magnetic resonance imaging method comprising: acquiring echo signals by echo planar imaging which generates the echo signals with correcting and applying plural gradient magnetic fields for phase encode and with continuously inverting a gradient magnetic field for readout after one nuclear magnetic excitation, the plural gradient magnetic fields for phase encode each having an intensity set so as to compensate an influence of an eddy current distributing spatially adaptively to each of imaging positions; and generating image data based on the echo signals, in an aspect to achieve the object.

The magnetic resonance imaging apparatus and the magnetic resonance imaging method according to the present invention as described above make it possible to reduce a distortion, of which amount varies depending on a spatial position of an imaging section, in an image occurring due to eddy currents.

BRIEF DESCRIPTION OF THE DRAWINGS

In the accompanying drawings:

FIG. 10 is a table showing an example of parameters stored in the eddy current parameter storage part shown in FIG. 5;

FIG. 11 is a diagram explaining a method for integration processing of components of eddy currents in a target axis direction by the gradient magnetic field correction part shown in FIG. 5;

DESCRIPTION OF THE PREFERRED EMBODIMENTS

A magnetic resonance imaging apparatus and a magnetic resonance imaging method according to embodiments of the present invention will be described with reference to the accompanying drawings.

Figure 4:
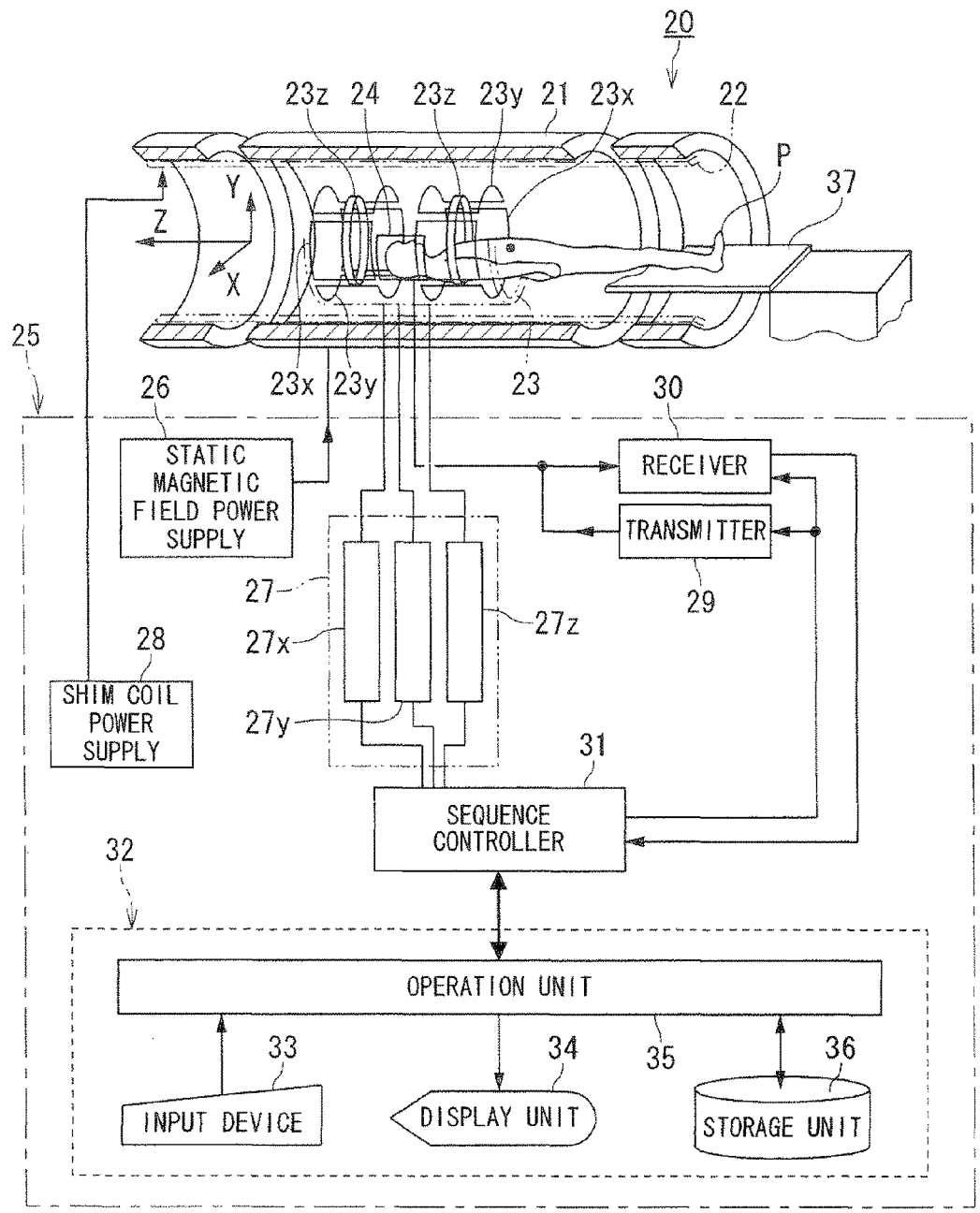
FIG. 4 is a block diagram showing a magnetic resonance imaging apparatus according to an embodiment of the present invention.

FIG. 4 is a block diagram showing a magnetic resonance imaging apparatus according to an embodiment of the present invention.

A magnetic resonance imaging apparatus 20 includes a static field magnet 21 for generating a static magnetic field, a shim coil 22 arranged inside the static field magnet 21 which is cylinder-shaped, a gradient coil 23 and a RF coil 24. The static fueled magnet 21, the shim coil 22, the gradient coil 23 and the RF coil 24 are built in a gantry (not shown).

The magnetic resonance imaging apparatus 20 also includes a control system 25. The control system 25 includes a static magnetic field power supply 26, a gradient power supply 27, a shim coil power supply 28, a transmitter 29, a receiver 30, a sequence controller 31 and a computer 32. The gradient power supply 27 of the control system 25 includes an X-axis gradient power supply 27x, a Y-axis gradient power supply 27y and a Z-axis gradient power supply 27z. The computer 32 includes an input device 33, a display unit 34, a operation unit 35 and a storage unit 36.

The static field magnet 21 communicates with the static magnetic field power supply 26. The static magnetic field power supply 26 supplies electric current to the static field magnet 21 to get the function to generate a static magnetic field in a imaging region. The static field magnet 21 includes a superconductivity coil in many cases. The static field magnet 21 gets current from the static magnetic field power supply 26 which communicates with the static field magnet 21 at excitation. However, once excitation has been made, the static field magnet 21 is usually isolated from the static magnetic field power supply 26. The static field magnet 21 may include a permanent magnet which makes the static magnetic field power supply 26 unnecessary.

The static field magnet 21 has the cylinder-shaped shim coil 22 coaxially inside itself. The shim coil 22 communicates with the shim coil power supply 28. The shim coil power supply 28 supplies current to the shim coil 22 so that the static magnetic field becomes uniform.

The gradient coil 23 includes an X-axis gradient coil 23x, a Y-axis gradient coil 23y and a Z-axis gradient coil 23z. Each of the X-axis gradient coil 23x, the Y-axis gradient coil 23y and the Z-axis gradient coil 23z which is cylinder-shaped is arranged inside the static field magnet 21. The gradient coil 23 has also a bed 37 in the area formed inside it which is an imaging area. The bed 37 supports an object P. Around the bed 37 or the object P, the RF coil 24 may be arranged instead of being built in the gantry.

The gradient coil 23 communicates with the gradient power supply 27. The X-axis gradient coil 23x, the Y-axis gradient coil 23y and the Z-axis gradient coil 23z of the gradient coil 23 communicate with the X-axis gradient power supply 27x, the Y-axis gradient power supply 27y and the Z-axis gradient power supply 27z of the gradient power supply 27 respectively.

The X-axis gradient power supply 27x, the Y-axis gradient power supply 27y and the Z-axis gradient power supply 27z supply currents to the X axis gradient coil 23x, the Y-axis gradient coil 23y and the Z-axis gradient coil 23z respectively so as to generate gradient magnetic fields Gx, Gy and Gz in the X, Y and Z directions in the imaging area.

The RF coil 24 communicates with the transmitter 29 and the receiver 30. The RF coil 24 has a function to transmit a RF signal given from the transmitter 29 to the object P and receive a NMR signal generated due to a nuclear spin inside the object P which is excited by the RF signal to give to the receiver 30.

The sequence controller 31 of the control system 25 communicates with the gradient power supply 27, the transmitter 29 and the receiver 30. The sequence controller 31 has a function to storage sequence information describing control information needed in order to make the gradient power supply 27, the transmitter 29 and the receiver 30 drive and generate gradient magnetic fields Gx, Gy and Gz in the X, Y and Z directions and a RF signal by driving the gradient power supply 27, the transmitter 29 and the receiver 30 according to a predetermined sequence stores. The control information above-described includes motion control information, such as intensity, impression period and impression timing of the pulse electric current which should be impressed to the gradient power supply 27

The sequence controller 31 is also configured to give raw data to the computer 32. The raw data is complex data obtained through the detection of a NMR signal and A/D conversion to the NMR signal detected in the receiver 30.

The transmitter 29 has a function to give a RF signal to the RF coil 24 in accordance with control information provided from the sequence controller 31. The receiver 30 has a function to generate raw data which is digitized complex number data by detecting a NMR signal given from the RF coil 24 and performing predetermined signal processing and A/D converting to the NMR signal detected. The receiver 30 also has a function to give the generated raw data to the sequence controller 31.

The computer 32 gets various functions by the operation unit 35 executing some programs stored in the storage unit 36 of the computer 32. Alternatively, some specific circuits having various functions may be provided with the magnetic resonance imaging apparatus 20 instead of using some of the programs.

Figure 5:
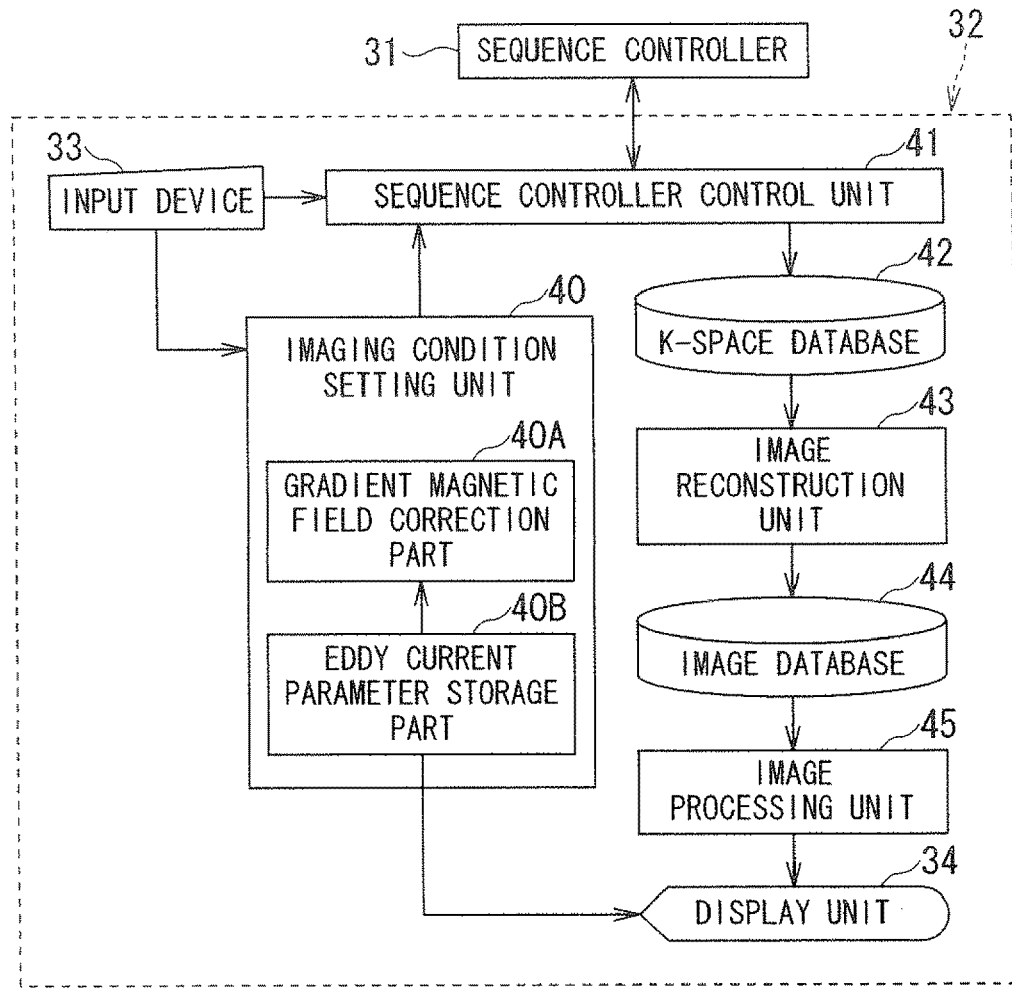
FIG. 5 is a functional block diagram of the computer shown in FIG. 4.

FIG. 5 is a functional block diagram of the computer 32 shown in FIG. 4.

The computer 32 functions as an imaging condition setting unit 40, a sequence controller control unit 41, a k-space database 42, an image reconstruction unit 43, an image database 44 and an image processing unit 45 by program. The imaging condition setting unit 40 includes a gradient magnetic field correction part 40A and an eddy current parameter storage part 40B.

The imaging condition setting unit 40 has a function to set an imaging condition using a SS EPI sequence based on instruction information from the input device 33 and to provide the set imaging condition to the sequence controller control unit 42. SS EPI sequences include a SS SE EPI sequence and a SS FE EPI sequence.

The gradient magnetic field correction part 40A in the imagine condition setting unit 40 has a function to set intensities of both TUNEs and BLIP pulses or intensities of BLIP pulses in a SS EPI sequence so that a change of a gradient magnetic field influenced by eddy currents occurring due to applications of gradient magnetic fields is canceled. That is, the gradient magnetic field correction part 40A has a function to correct a gradient magnetic field moment by adjusting intensities of TUNEs and/or BLIP pulses so that influence of eddy currents is canceled. If an image is reconstructed with using echo signals acquired under a state in which correction of a gradient magnetic field moment is performed so that influence of eddy currents is canceled like this, a distortion of the image attributed to the eddy currents can be suppressed and image quality deterioration can be prevented.

Figure 6:
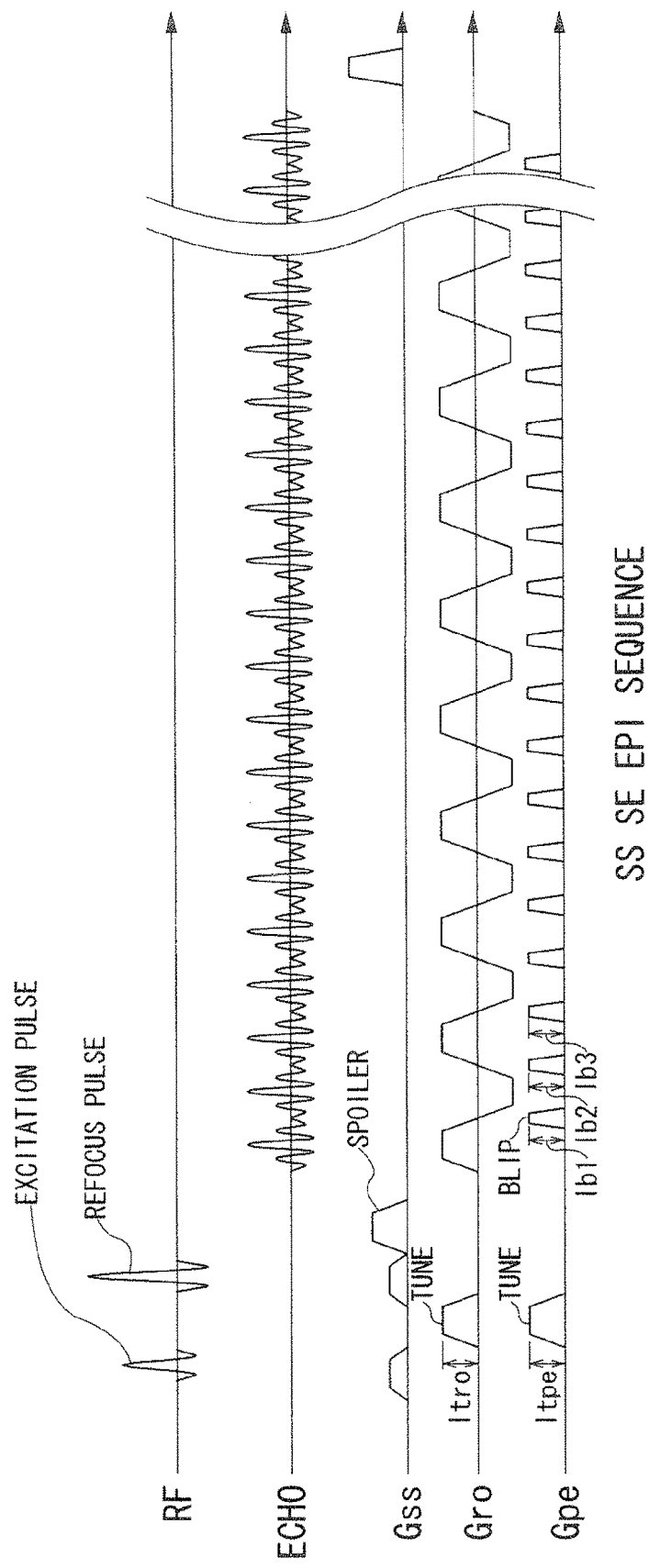
FIG. 6 is a diagram showing an example of SS SE EPI sequence set as an imaging condition by the imaging condition setting unit shown in FIG. 5.

FIG. 6 is a diagram showing an example of SS SE EPI sequence set as an imaging condition by the imaging condition setting unit 40 shown in FIG. 5.

In FIG. 6, RF denotes RF excitation pulses, ECHO denotes echo signals, Gss denotes gradient magnetic fields in the SS direction, Gro denotes gradient magnetic fields in the RO direction and Gpe denotes gradient magnetic fields in the PE direction respectively.

As shown in FIG. 6, in a SS SE EPI sequence, a refocus pulse is applied with a gradient magnetic field pulse for slice selection subsequently to an excitation pulse. Between the excitation pulse and the refocus pulse, TUNEs for adjusting a gradient magnetic field moment are applied in a RO direction and a PE direction. In addition, a spoiler gradient magnetic field pulse for the refocus pulse is applied in a SS direction after applying the refocus pulse. Note that, FIG. 6 shows an example that a TUNE is applied between the excitation pulse and the refocus pulse, however, the TUNE may be applied at another timing.

Next, a BLIP pulse for encode addition is applied repeatedly in the PE direction and a phase encode amount depending on an intensity of each BLIP pulse is added sequentially. On the other hand, a gradient magnetic field in the PO direction of which polarity inverts alternately is applied repeatedly. Consequently, echo signals necessary for generating image data for a single image occur continuously and the echo signals are acquired. That is, echo signals for generating image data for a single image can be acquired by a single nuclear magnetic excitation.

Here, an intensity Itro of the TUNE in the RO direction, an intensity Itpe of the TUNE in the PE direction and an intensity Ib1, Ib2, Ib3, . . . of each BLIP pulse are set by the gradient magnetic field correction part 40A so that a change of the gradient magnetic field moment by influence of eddy currents generated due to gradient magnetic fields applied before an application of each pulse is cancelled. Note that, the intensity Itro of the TUNE in the RO direction and/or the intensity Itpe of the TUNE in the PE direction may be set to original values without considering eddy currents.

In the imaging condition setting unit 40, a SS EPI sequence for a DWI with an application of a MPG pulse can be also set as an imaging condition.

Figure 7:
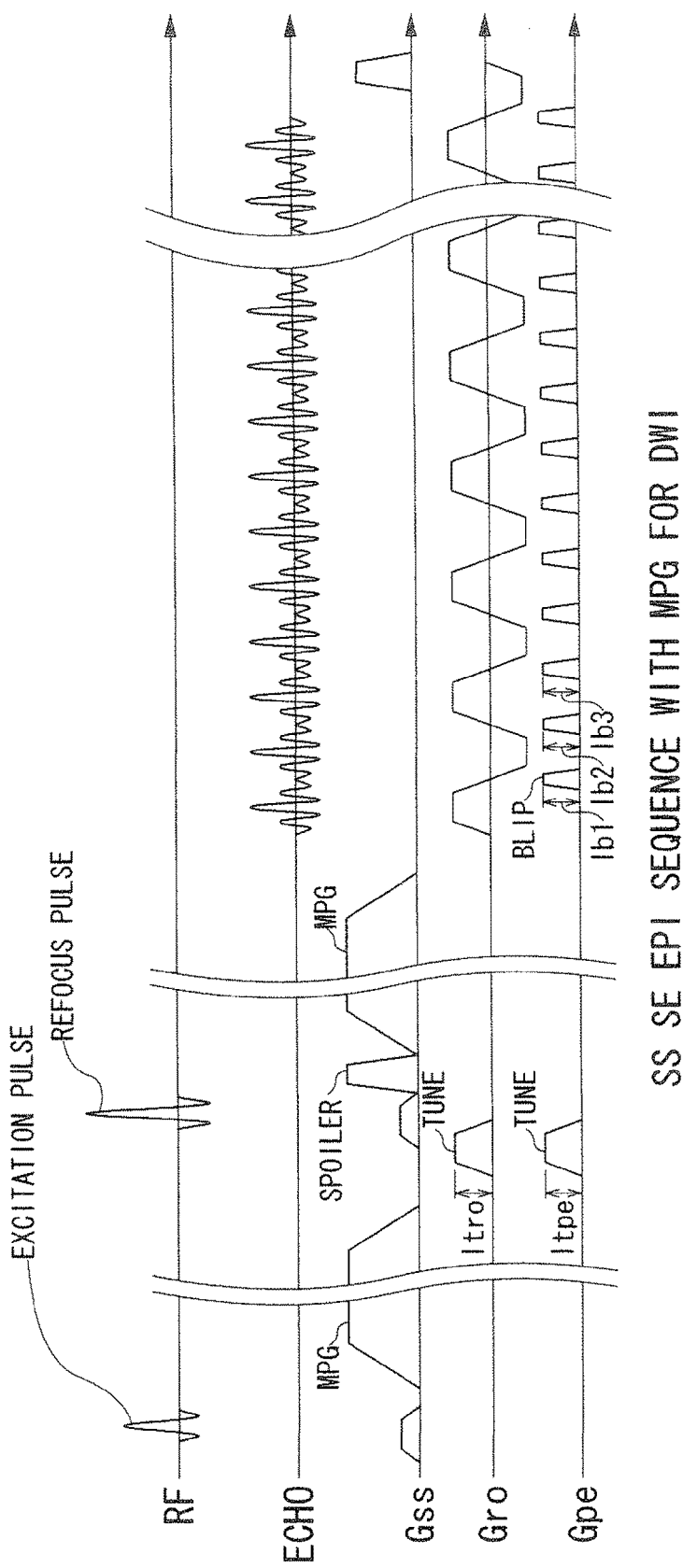
FIG. 7 is a diagram showing an example of SS SE EPI sequence for DWI set as an imaging condition by the imaging condition setting unit shown in FIG. 5.

FIG. 7 is a diagram showing an example of SS SE EPI sequence for DWI set as an imaging condition by the imaging condition setting unit 40 shown in FIG. 5.

In FIG. 7, RF denotes RF excitation pulses, ECHO denotes echo signals, Gss denotes gradient magnetic fields in the SS direction, Gro denotes gradient magnetic fields in the RO direction and Gpe denotes gradient magnetic fields in the PE direction respectively.

In case of acquiring a DWI, or example, as shown in FIG. 7, MPG pulses are applied after applying the excitation pulse and after applying the spoiler gradient magnetic field pulse. A DWI can be acquired by performing a SS SE EPI sequence with an application of MPG pulses like this.

Note that, in FIG. 7, an example that a unipolar type of MPG pulses is applied is shown, however, a bipolar type or double spin echo type of MPG pulses may be applied.

Since a MPG pulse has a considerably long application time compared to an attenuation time of an eddy current, the MPG pulse often decays after an eddy current generated due to a change of gradient magnetic field in a rising edge part of the MPG pulse attenuates. Therefore, a dominant eddy current occurs after an application of a MPG pulse due to a change of gradient magnetic field n a decaying edge part of the MPG pulse. To the contrary, another gradient magnetic field pulse often has a relative short application time compared to an attenuation time of an eddy current. For this reason, an eddy current generated due to a change of gradient magnetic field in a rising edge part of another gradient magnetic field pulse is canceled with an eddy current generated due to a change of gradient magnetic field in the decaying edge part. Consequently, an eddy current generated due to an application of a gradient magnetic field pulse other than a MPG pulse does not often become dominant.

For that reason, in a SS SE EPI sequence for DWI as well as a SS SE EPI sequence for non-DWI shown in FIG. 6, an intensity Itro of a TUNE in the RO direction, an intensity Itpe of a TUNE in the PE direction and an intensity Ib1, Ib2, Ib3, . . . of each BLIP pulse are set by the gradient magnetic field correction part 40A so that a change of a gradient magnetic field moment by influence of eddy currents generated due to gradient magnetic fields including MPG pulses applied before applying each pulse is cancelled. Note that, the intensity Itro of she TUNE in the RO direction and/or the intensity Itpe of the TUNE in the PE direction may be set to an original value without considering eddy currents.

Next, how to calculate each intensity I of the TUNEs and the BLIP pulses will be described. Since each intensity I of the TUNEs and the BLIP pulses has X-axis direction component TX, Y-axis direction component Iy and Z-axis direction component Iz, it is necessary to calculate components in the X-axis direction, the Y-axis direction and the Z-axis direction of eddy currents distributing on a space including positions of imaging sections in order to calculate each intensity I (Ix, Iy, Iz) of the TUNEs and the BLIP pulses.

The component, in each axial direction, of an eddy current generated in the case of applying a gradient magnetic field having unit intensity can be approximated with using a high order expression. Practically, the component of an eddy current in each axial direction can be approximated by a quadratic expression or a three order expression. For example, the component rz, in a Z-axis direction, of an eddy current r (rx, ry, rz) generated in the case of applying a gradient magnetic field having unit intensity can be approximated with using a quadratic expression with regard to a spatial position Z in the Z axis direction as expression (1).

$$rz = Sc(aZ^2 + bZ + c) \quad (1)$$

In expression (1), a, b and c are coefficients for respective terms and Sc is a scaling factor. These coefficients a, b and c and the scaling value Sc are determined depending on characteristics of an apparatus. The scaling factor Sc may have plural values depending on characteristics of an apparatus. This is the same for an X-axis direction and a Y-axis direction.

That is, as shown in expression (1), an eddy current r can be calculated at every imaging position. Note that, in the case of approximating an eddy current r with using a three order expression or a our order expression, there is a case where an eddy current r can be regarded as being constant without depending on an imaging position within a certain range of imaging part.

Figure 8:
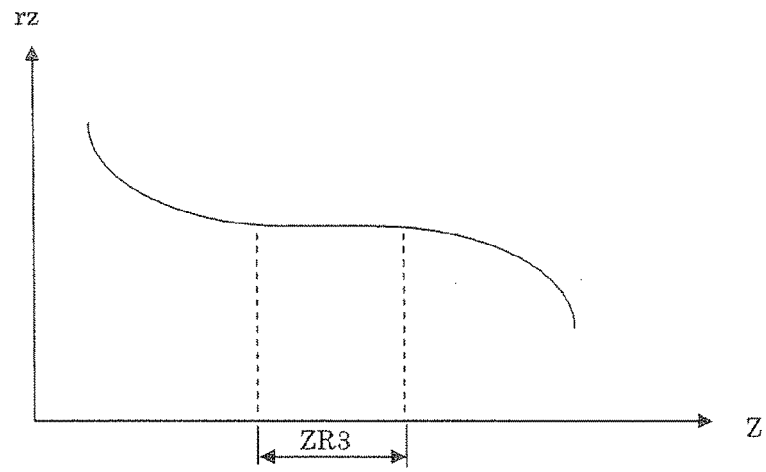
FIG. 8 is a graph showing an example case where a component rz of an eddy current r in the Z axis direction can be regarded as constant within a certain range in the Z axis direction by approximating the component rz of the eddy current r in the Z axis direction with a three-dimensional expression.
Figure 9:
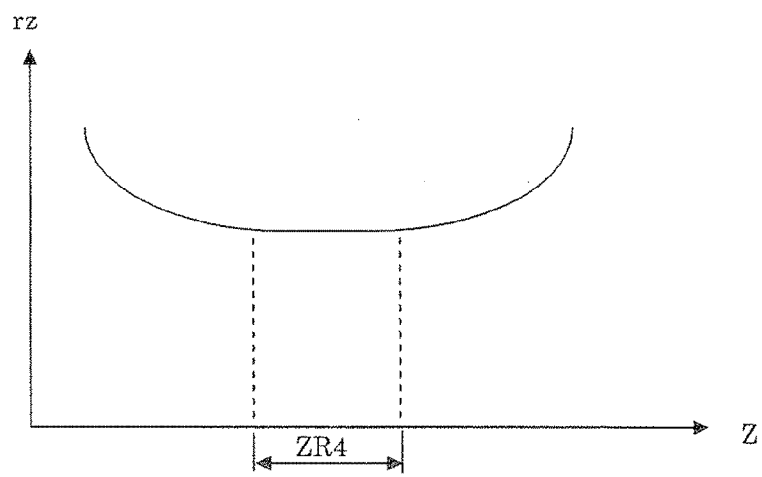
FIG. 9 is a graph showing an example case where a component rz of an eddy current r in the Z axis direction can be regarded as constant within a certain range in the Z axis direction by approximating the component rz of the eddy current r in the Z axis direction with a four-dimensional expression.

FIG. 8 is a graph showing an example case where a component rz of an eddy current r in the Z axis direction can be regarded as constant within a certain range in the Z axis direction by approximating the component rz of the eddy current r in the Z axis direction with a three-dimensional expression. FIG. 9 is a graph showing an example case where a component rz of an eddy current r in the Z axis direction can be regarded as constant within a certain range in the Z axis direction by approximating the component rz of the eddy current r in the Z axis direction with a four-dimensional expression.

In each of FIGS. 8 and 9, the abscissa axis denotes the Z axis direction and the ordinate axis denotes the component rz of the eddy current r in the Z axis direction. As shown in FIG. 8 and FIG. 9, the component rz of an eddy current r in the Z-axis direction can be regarded as constant in certain ranges ZR3 and ZR4 in central regions in the Z-axis direction. In the case described above, it is efficient that the component rz of the eddy current r in the Z-axis direction is regarded as a constant value in the certain ranges ZR3 and ZR4 while the component rz in the Z-axis direction is expressed with using a three order expression or a four order expression locally in the edge parts out of the certain ranges ZR3 and ZR4 in the Z-axis direction from the perspective of simplifications of calculation and processing. This is the same for an X-axis direction and a Y-axis direction.

On the other hands, an intensity R(t) of an eddy current at a time point after a time t from applying a gradient magnetic field pulse having an intensity H (Hx, Hy, Hz) is expressed as expression (2).

$$R(t) = rH\exp(-t/T) \quad (2)$$

In expression (2), T (Tx, Ty, Tz) is a time constant of attenuation of an eddy magnetic field. The time constant T is also determined as a pair of parameters with a scaling factor Sc depending on characteristics of an apparatus.

These coefficients a, b and c, a scaling factor Sc and/or a time constant T for obtaining an intensity R(t) of an eddy current can be measured in advance, parameterized and stored at setting up an apparatus and the like. Alternatively, coefficients a, b and c, a scaling factor Sc and/or a time constant T can be measured by a test imaging. In the case of existing plural (the number n of) time constants, information measured in advance is sets of Tn, an, bn, cn and Scn.

Note that, when a gradient magnetic field is applied to a certain axis, eddy currents also occur in other axis directions. Therefore, each coefficient of high order expressions with regard to three axis directions influenced in the case of applying a gradient magnetic field in one axis direction is necessary for calculating components of eddy currents. Since application axes of a gradient magnetic field include three axis directions of X, Y and Z and axes influenced by a gradient magnetic field in each axis direction are three axis directions of X, Y and Z, a total of sets of coefficients in nine high order expressions are parameters to be obtained in advance.

As mentioned above, it is necessary to store parameters such as coefficients a, b and c, scaling factors Sc and attenuation time constants T of eddy magnetic fields for calculating components R (Rx, Ry, Rz, t) in the respective axis directions of a eddy current generated in the case of applying a gradient magnetic field having a certain intensity H. That is, component of an eddy current in each axis direction can be expressed by using coefficient values in respective terms of a high order expression including cross terms, a scaling factor and an attenuation time constant of an eddy magnetic field as parameters.

These parameters for calculating an eddy current value in each axis direction every imaging position are stored in the eddy current parameter storage part 40B and the gradient magnetic field correction part 40A is configured to be able to refer to the parameters in the eddy current parameter storage part 40B.

FIG. 10 is a table showing an example of parameters stored in the eddy current parameter storage part 40B shown in FIG. 5.

FIG. 10 shows sets of parameters stored in the eddy current parameter storage part 403 in the case of approximating a component in each axis direction of an eddy current by a quadratic expression. That is, each of totally nine sets of parameters for application axes of a gradient magnetic field and influenced axes is stored as a parameter set with a pair of a time constant and a scaling factor. A time constant and a scaling factor may have plural values depending on characteristics of an apparatus such as member, FIG. 10 shows an example of two values. Consequently, nine parameter sets are obtained every time constant and every scaling factor in advance and stored in the eddy current parameter storage part 40B.

When parameters as shown in FIG. 10 are prepared, an intensity of a gradient magnetic field to be applied for cancelling a change amount of a magnetic moment attributed to eddy currents at applying a TUNE or a BLIP pulse can be calculated in the gradient magnetic field correction part 40A. Specifically, the intensity I (Ix, Iy, Iz, n) of the gradient magnetic field pulse such as a TUNE or a BLIP pulse to be applied n-th is sum of an original intensity I0 (I0x, I0y, I0z, n) without considering eddy currents and a correction intensity Ic (Icx, Icy, Icz, n) of a gradient magnetic field (a correction amount of an intensity of a gradient magnetic field pulse) to be applied for cancelling a change amount of a magnetic moment attributed to eddy currents, as shown in the expression (3).

$$I(n)=I0+Ic(n) \quad (3)$$

A correction intensity Ic(n) for a gradient magnetic field pulse applied n-th for canceling a change amount of a magnetic moment attributed to eddy currents can be calculated as expression (4).

$$Ic(n)=rH_{n-1}\exp(-t_{n-1}/T)+rH_{n-2}\exp(-t_{n-2}/T)+rH_{n-3}\exp(-t_{n-3}/T)+\ldots+rH_{n-ne}\exp(-t_{n-ne}/T) \quad (4)$$

Note that, in expression (4), Hi and ti denote an intensity of the i-th gradient magnetic field pulse and a difference between application times of the n-th gradient magnetic field pulse and the i-th gradient magnetic field pulse (lapse time) respectively. Since an intensity Hi of the i-th gradient magnetic field pulse is an intensity I(i) corrected so as to cancel a change amount of a magnetic moment attributed to eddy currents by the expression (3) exactly, the expression (4) represents a recursive calculation. However, since a correction intensity Ic of a gradient magnetic field pulse is negligibly small compared to an original intensity IC before correction, an intensity Hi of the i-th gradient magnetic field pulse can be regarded as an original intensity I0(i) before correction of the i-th gradient magnetic field pulse.

Specifically, a correction intensity Ic(n) of the gradient magnetic field pulse applied n-th can be calculated by integrating component values, in each axis direction, of eddy currents, due to gradient magnetic field pulses having intensities $H_{n-1}, H_{n-2}, H_{n-3}, \ldots, H_{n-ne}$ having been applied before the n-th gradient magnetic field pulse, after attenuation according to a time constant T and lapse times $t_{n-1}, t_{n-2}, t_{n-3}, \ldots, t_{n-ne}$. That is to say, a gradient magnetic field moment necessary for correction can be calculated by integrating components of remaining eddy currents in a target axis direction, at every spatial position, generated by respective gradient magnetic field pulses having been applied before applying a gradient magnetic field pulse to be a correction target.

Note that, the number one of component values of eddy currents attributed to gradient magnetic field pulses to be integrated is determined so that the lapse time $t_{n-ne}$ becomes long enough. The component values of eddy currents attributed to all gradient magnetic field pulses can be set to integration targets. However, if component values of eddy currents attributed to a part of gradient magnetic field pulses determined so that the lapse time $t_{n-ne}$ becomes long enough are set to integration targets, a processing amount can be reduced. The number ne of component values of eddy currents to be targets of integration changes depending on characteristics of an apparatus. Specifically, it is thought that satisfactory accuracy can be obtained if the number ne of component values of eddy currents to be targets of integration is determined so that the lapse time $t_{n-ne}$ keeps around 10 seconds.

Since the term gradient magnetic field pulses here include all gradient magnetic field pulses such as spoiler gradient magnetic field pulses and MPG pulses, it is preferable that eddy currents generated by gradient magnetic field pulses, such as MPG pulses, each having a non-negligible high intensity after attenuation are to be targets of integration. In addition, in the case of multi shots imaging in which excitation pulses and MPG pulses of plural shots are applied, there is a possibility that a single or plural MPG pulses in past shots also generate non-negligible eddy currents. Therefore, it may be preferable that a single or plural MPG pulses in past shots are set to be targets of integration. A MPG pulse having a different b value and a MPG pulse in a different application axis is an example of MPG pulse in a past shot.

On the other hand, excluding gradient magnetic field pulses each generating only a negligible eddy current from targets of integration leads to reduction of a data processing amount. Therefore, for example, a desired method can be selected from a method for setting only MPG pulses to targets of integration, a method for setting only MPG pulses and spoiler gradient magnetic field pulses to targets of integration, a method for setting only gradient magnetic field pulses within a certain lapse time $t_{n-ne}$ to targets of integration and a method for setting only MPG pulses and gradient magnetic field pulses in a certain lapse time $t_{n-ne}$ to targets of integration.

FIG. 11 is a diagram explaining a method for integration processing of components of eddy currents in a target axis direction by the gradient magnetic field correction part 40A shown in FIG. 5.

The abscissa axis in FIG. 11 denotes time. As shown in FIG. 11, an intensity I(n) of the gradient magnetic field pulse applied n-th is sum of an original intensity I0 in the case where eddy currents are not considered and a correction intensity Ic(n) for the n-th gradient magnetic field pulse to be applied for cancelling a change amount of a magnetic moment attributed to eddy currents as shown in the expression (3). The correction intensity Ic(n) for the n-th gradient magnetic field pulse can be calculated by integrating component values, in a target axis direction, of eddy currents, generated by applying the gradient magnetic field pulses with intenstities $H_{n-1}, H_{n-2}, H_{n-3}, \ldots, H_{n-ne}$ having been applied the (n−1)-th, (n−2)-th, (n−3)-th, ..., (n−ne)-th, after attenuation according to the lapse times $t_{n-1}, t_{n-2}, t_{n-3}, \ldots, t_{n-ne}$.

Then, image data in which influence of eddy currents is suppressed can be acquired by applying TUNEs and BLIP pulses in the condition that a correction intensity Ic(n) for gradient magnetic field pulse is added to each state part in which each intensity of TUNEs and BLIP pulses is not zero, i.e., an original intensity I0.

That is, since a correction intensity Ic(n) for a gradient magnetic field pulse is obtained at every imaging position (X, Y, Z) based on an intensity r(rx, ry, rz) of a spatial eddy current, the influence of eddy currents each having a spatial distribution can be suppressed. Note that, as described above, in the case where an intensity r (rx, ry, rz) of an eddy current is regarded as constant in a certain range, a correction intensity Ic(n) for a gradient magnetic field pulse becomes constant without depending on imaging positions (X, Y, Z) in the range. Meanwhile, the correction intensity Ic(n) of the gradient magnetic field pulse varies at every imaging position (X, Y, Z) locally out of the range. Consequently, in the case of existing an eddy current which distributes locally and non-uniformly, the influence of eddy currents can be corrected locally with a lower data processing amount. As described above, a correction intensity Ic(n) for a gradient magnetic field pulse is determined with corresponding to an imaging position and the influence of eddy currents can be corrected.

For that purpose, an imaging condition including the SS EPI sequence determined like this is provided to the sequence controller control unit 41 from the imaging condition setting unit 40.

The sequence controller control unit 42 has a function for controlling the driving of the sequence controller 31 by giving an imaging condition including a SS EPI sequence to the sequence controller 31 based on information instructing scan start from the input device 33. In addition, the sequence controller control unit 42 has a function for receiving raw data from the sequence controller 31 and arranging the raw data to k space formed in the k-space database 42. Therefore, the k-space database 42 stores the raw data generated by the receiver 30 as k space data. That is, k-space data is arranged in the k-space formed in the k-space database 42.

The image reconstruction unit 43 has a function for reconstructing image data, which is real space data, of an object P from k-space data by capturing the k-space data from the k-space database 42 and performing image reconstruction processing including two or three dimensional FT of the k-space data, and writing the generated image data to the image database 44. Therefore, the image database 44 stores the image data reconstructed by the image reconstruction unit 43.

The image processing unit 45 has a function for generating image data for displaying by performing necessary image processing of image data read form the image database 44 and displaying the generated image data for displaying on the display unit 34.

Then, the operation and action of a magnetic resonance imaging apparatus 20 will be described.

Figure 1:
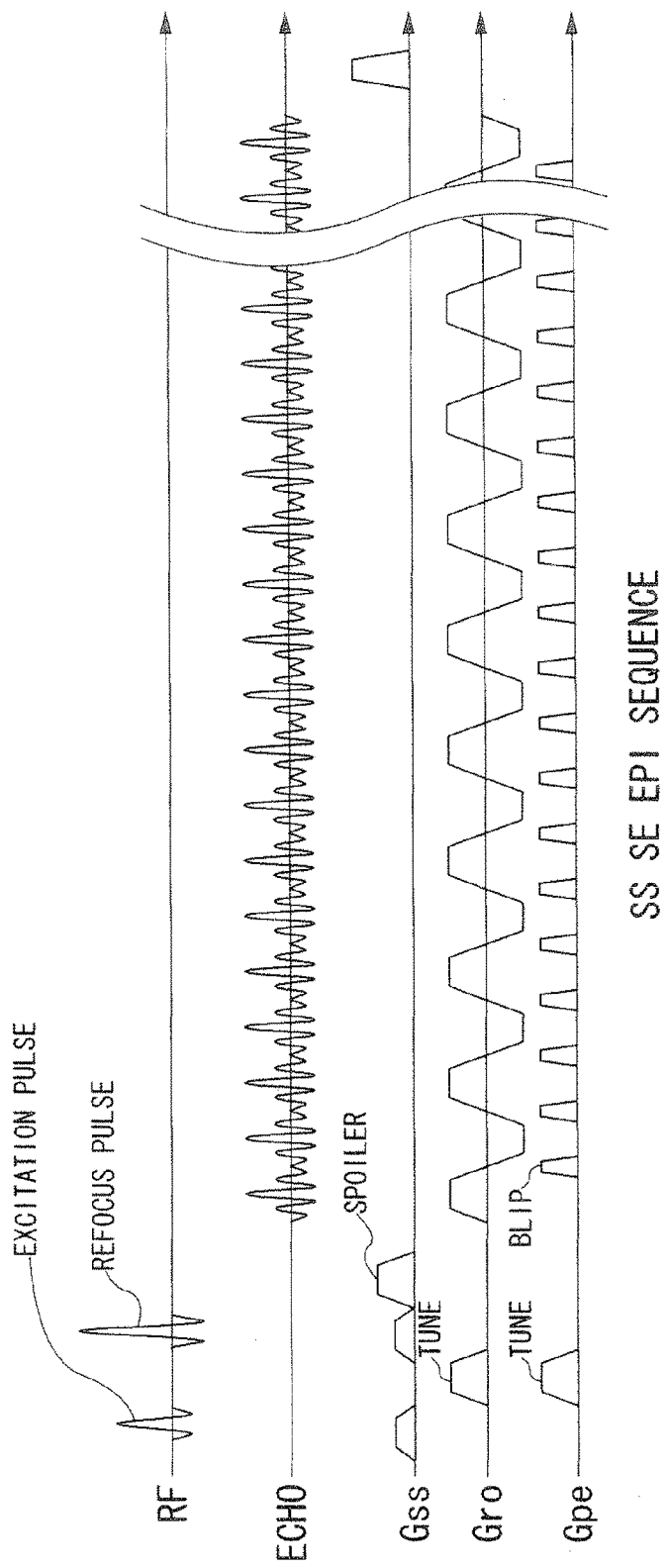
FIG. 1 is a diagram showing the conventional SS SE EPI sequence.
Figure 2:
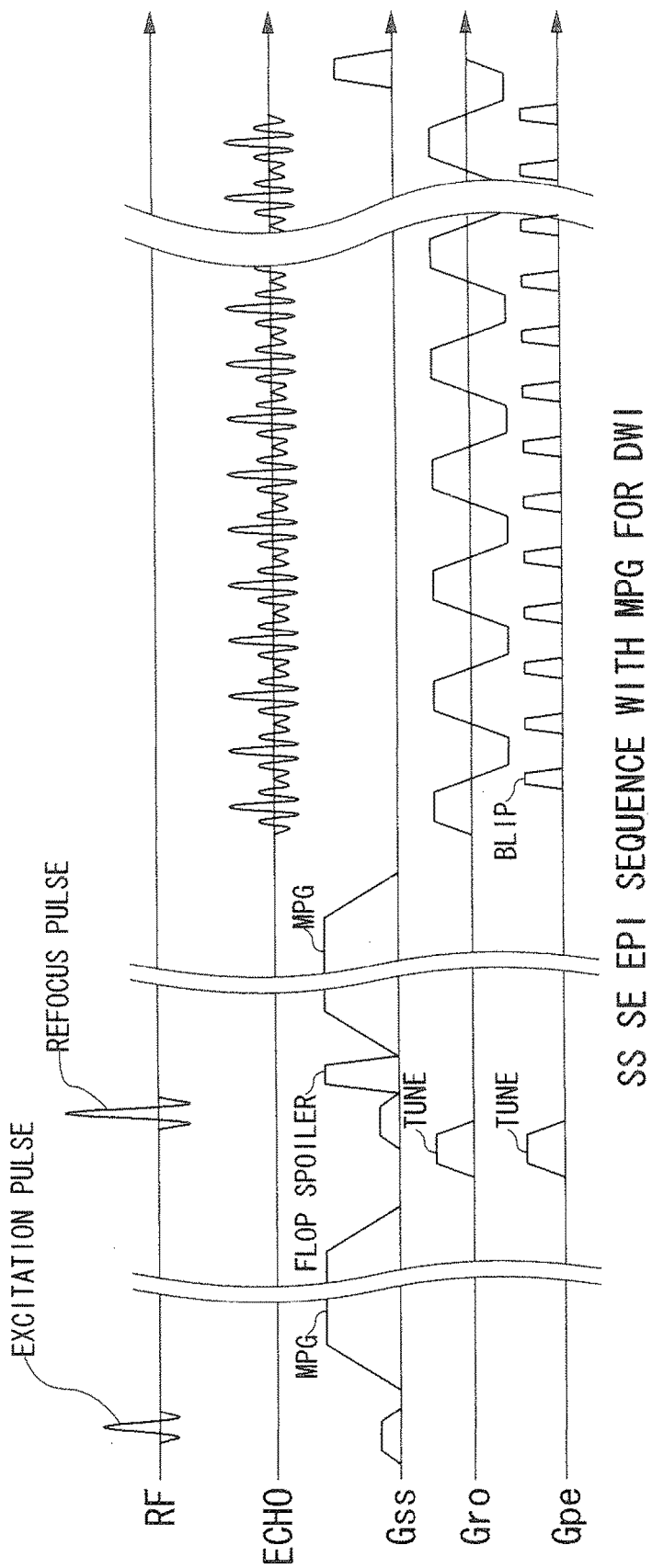
FIG. 2 is a diagram showing the conventional SS SE EPI sequence with applying MPG pulses for DWI.
Figure 12:
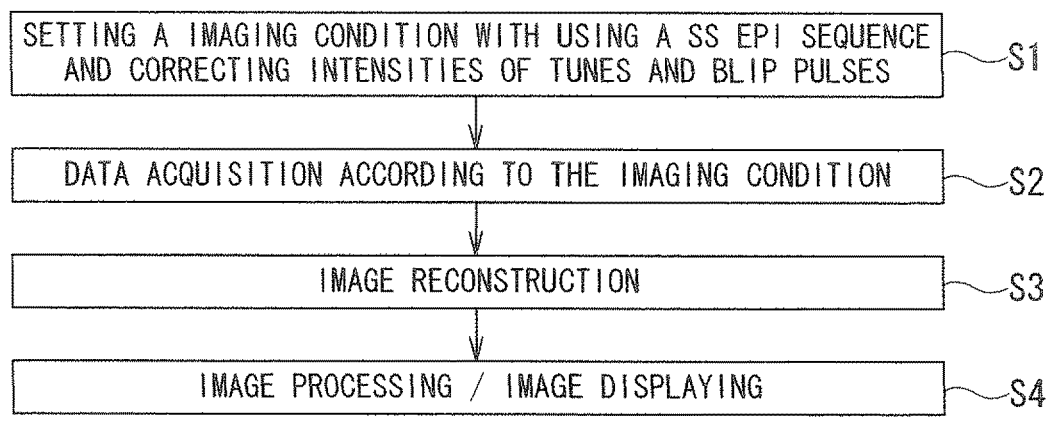
FIG. 12 is a flowchart showing a procedure for acquiring an image of the object with the magnetic resonance imaging apparatus shown in FIG. 1.

FIG. 12 is a flowchart showing a procedure for acquiring an image of the object P with the magnetic resonance imaging apparatus 20 shown in FIG. 1. The symbols including S with a number in FIG. 12 indicate each step of the flowchart.

First, in step S1, a SS EPI sequence in which each intensity of both TUNEs and BLIP pulses or BLIP pulses is set so that a change of a gradient magnetic field moment by eddy currents is canceled as shown in FIG. 6 is set as an imaging condition in the imaging condition setting unit 40. For that purpose, the gradient magnetic field correction part 40A calculates a correction amount for each intensity of TUNEs and/or BLIP pulses for cancelling a change of a gradient magnetic field moment due to eddy currents by referring parameters relating to an eddy current stored in the eddy current parameter storage part 40B and calculating component values of the eddy currents in each axis direction. Then, each intensity of the TUNEs and/or the BLIP pulses is corrected with using the obtained correction amount.

Subsequently, in step S2, data acquisition is performed according to the set imaging condition.

For that purpose, the object P is previously set to the bed 37, and a static magnetic field is generated at an imaging area of the magnet 21 (a superconducting magnet) for static magnetic field excited by the static-magnetic-field power supply 26. Further, the shim-coil power supply 28 supplies current to the shim coil 22, thereby uniformizing the static magnetic field generated at the imaging area.

Then, the input device 33 sends instruction of starting data acquisition to the sequence controller control unit 41. The sequence controller control unit 41 supplies an imaging condition using a SS EPI sequence received from the imaging condition setting unit 40 to the sequence controller 31. Therefore, the sequence controller 31 drives the gradient power supply 27, the transmitter 29, and the receiver 30 in accordance with the SS EPI sequence received from the sequence controller control unit 41, thereby generating gradient magnetic fields in the imaging area having the set object P, and further generating RP signals from the RF coil 24.

Consequently, the RF coil 24 receives NMR signals generated due to nuclear magnetic resonance in the object P. Then, the receiver 30 receives the NMR signals from the RF coil 24 and generates raw data which is digital data of NMR signals by A/D conversion subsequently to necessary signal processing. The receiver 30 supplies the generated raw data to the sequence controller 31. The sequence controller 31 supplies the raw data to the sequence controller control unit 41. The sequence controller control unit 41 arranges the raw data as k-space data to the k space formed in the k-space database 42.

Subsequently, in step S3, image reconstruction processing is performed by the image reconstruction unit 43. Specifically, the image reconstruction unit 43 reads the k-space data from the k-space database 42 and performs image reconstruction processing including FT of the read k-space data, thereby reconstructing image data of the object P. The generated image data is written in the image database 44.

Subsequently, in step S4, the image processing unit 45 performs necessary image processing of the image data read from the image database 44, thereby displaying image data after image processing on the display unit 34.

Figure 13:
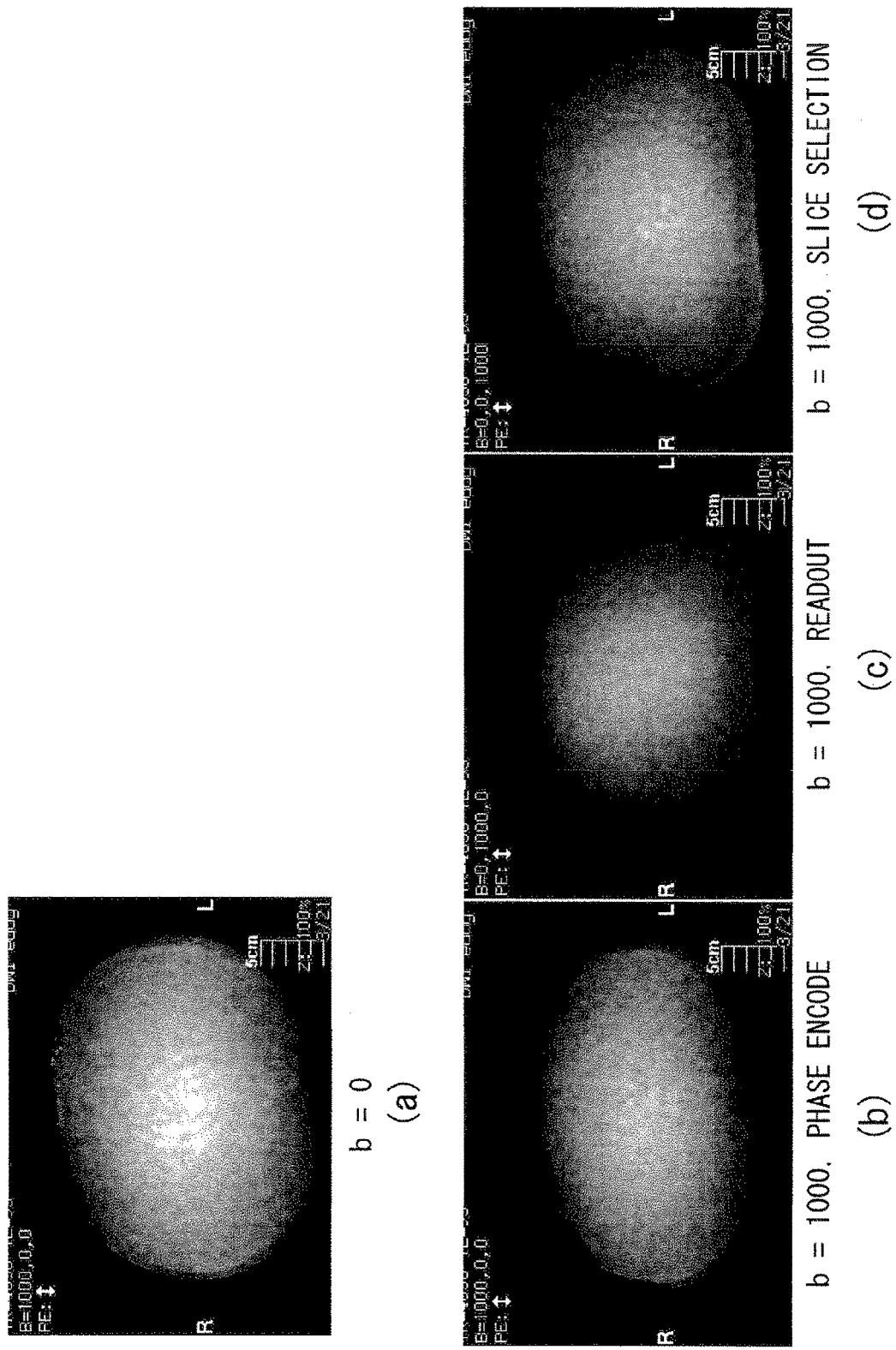
FIG. 13 is an example of images displayed on the display unit shown in FIG. 5.

FIG. 13 is an example of images displayed on the display unit 34 shown in FIG. 5.

FIG. 13 (a) is a reference image obtained with setting a b value representing a DWI intensity to zero and with offset of an imaging section to a reference position in which influence of eddy currents is small. FIG. 13 (b) is a DWI on a certain spatial position in case of setting a b value in a PE direction to 1000. FIG. 13 (c) is a DWI on the same spatial position in case of setting a b value in a RO direction to 1000. FIG. 13 (d) is a DWI on the same spatial position in case of setting a b value in a SS direction to 1000.

Figure 3:
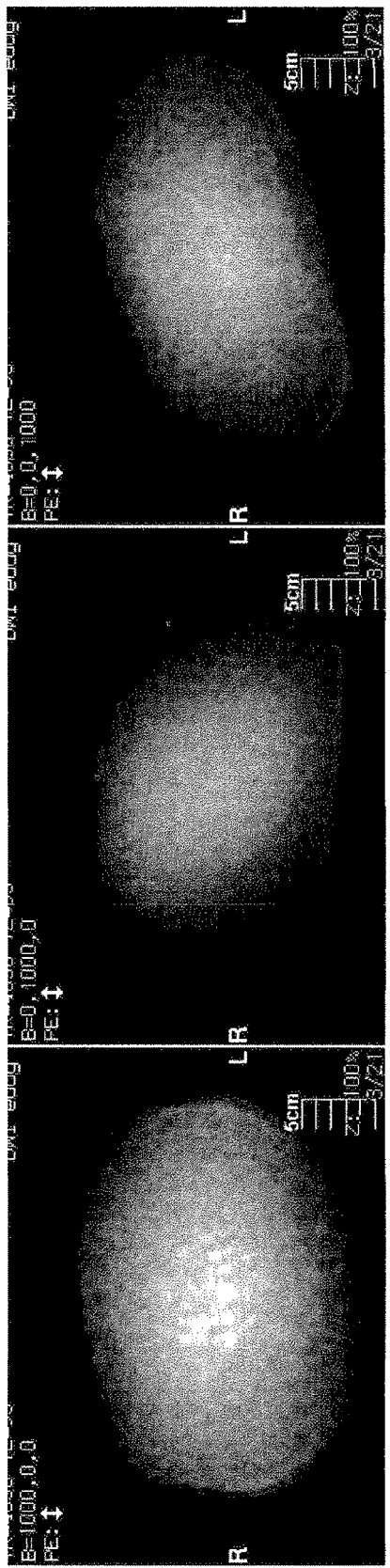
FIG. 3 is an example of DWIs, distorted due to influence of eddy currents, acquired by performing the conventional SS SE EPI sequence.

It can be confirmed that each deformation of the respective DWIs shown in FIG. 13 (b), FIG. 13 (c) and FIG. 13 (d) is hardly different from that of a reference image without applying a MPG pulse shown in FIG. 13 (a) in spite of a large eddy current generated by applying a MPG pulse with a relatively-high intensity. Especially, it can be confirmed that a deformation in a DWI acquired with increasing intensities of MPG pulses in the RO direction or the SS direction shown in FIG. 13 (c) or FIG. 13 (d) is improved drastically compared to the DWI shown in FIG. 3 (b) or FIG. 3 (c) imaged by performing the conventional SS SE EPI sequence. As mentioned above, though image deterioration such as blurring occurs in an isotropic image acquired without correcting image deformation by eddy currents, the image deterioration is improved vastly with correcting image deformation by each intensity correction of TUNEs and/or BLIP pulses.

That is, even though an eddy current is generated by applying a gradient magnetic field pulse with a high intensity like a MPG pulse, deterioration such as image deformation can be reduced with an influence of the eddy current by setting each intensity of TUNEs and/or BLIP pulses so that a change of a gradient magnetic field moment by the eddy current is canceled.

That is, the magnetic resonance imaging apparatus 20 as mentioned above is an apparatus to reduce image deterioration by adjusting intensities of TUNEs and/or a BLIP pulses so that image deformation due to an influence of an eddy current changing according to a spatial position of an image section is corrected in a SS EPI. More specifically, the magnetic resonance imaging apparatus 20 is an apparatus to correct an influence of an eddy current, corresponding to an imaging position, which causes image deformation by overlaying a gradient magnetic field of a SS EPI sequence with a correction amount determined so as to cancel the influence of the eddy current.

Consequently, even though an eddy current having a spatial distribution occurs, the magnetic resonance imaging apparatus 20 can reduce an influence of the eddy current and prevent image deformation. In a DWI with applying a MPG pulse with a particularly high intensity, a pronounced effect can be obtained.

What is claimed is:

1. A magnetic resonance imaging (MRI) apparatus comprising:
    a data acquisition unit configured to acquire echo signals by echo planar imaging which generates the echo signals by applying plural gradient magnetic field pulses for phase encoding and by repeatedly inverting a gradient magnetic field for readout after one nuclear magnetic resonance (NMR) excitation, the plural phase-encoding gradient magnetic field pulses each having an intensity set for each of plural spatial imaging positions so as to adaptively compensate an influence of spatially distributed eddy currents to each of the spatial imaging positions; and
    an image generating unit configured to generate MRI data and an image based on the acquired echo signals.

2. A magnetic resonance imaging apparatus of claim 1, wherein said data acquisition unit is configured to separately determine correction amounts for each of the plural phase-encoding gradient magnetic field pulses with regard to each of the spatial imaging positions.

3. A magnetic resonance imaging apparatus of claim 1, wherein said data acquisition unit is configured to set correction amounts for plural phase-encoding gradient magnetic field pulses corresponding to a certain range of the spatial imaging positions to be constant and to separately determine correction amounts for each of the phase-encoding gradient magnetic field pulses out of said certain range with regard to each of the spatial imaging positions.

4. A magnetic resonance imaging apparatus of claim 1, wherein said data acquisition unit is configured to set an intensity of a magnetic gradient tune pulse for adjusting a moment of gradient magnetic field so as to compensate the influence of the eddy current.

5. A magnetic resonance imaging apparatus of claim 1, wherein said data acquisition unit is configured to set intensities of the plural phase-encoding gradient magnetic field pulses so as to cancel a varying amount of a gradient magnetic field moment due to the eddy current.

6. A magnetic resonance imaging apparatus of claim 1, wherein said data acquisition unit is configured to set intensities of plural phase-encoding gradient magnetic field pulses so as to cancel a varying amount of a gradient magnetic field moment due to the eddy current by calculation of correction amounts for the plural phase-encoding gradient magnetic field pulses based on previously measured information and correction using the correction amounts.

7. A magnetic resonance imaging apparatus of claim 1, wherein said data acquisition unit is configured to acquire the echo signals by diffusion weighted imaging.

8. A magnetic resonance imaging apparatus of claim 7, wherein said data acquisition unit is configured to acquire the echo signals by applying a unipolar motion probing gradient (MPG) pulse.

9. A magnetic resonance imaging apparatus of claim 7, wherein said data acquisition unit is configured to acquire the echo signals by applying a bipolar motion probing gradient (MPG) pulse.

10. A magnetic resonance imaging apparatus of claim 7, wherein said data acquisition unit is configured to acquire the echo signals by applying a double spin echo motion probing gradient (MPG) pulse.

11. A magnetic resonance imaging apparatus of claim 7, wherein said data acquisition unit is configured to set intensities of the plural phase-encoding gradient magnetic field pulses so as to cancel an influence of an eddy current due to a motion probing gradient (MPG) pulse applied in a past shot.

12. A magnetic resonance imaging apparatus of claim 7, wherein said data acquisition unit is configured to set intensities of the plural phase-encoding gradient magnetic field pulses so as to cancel influences of respective eddy currents due to plural motion probing gradient (MPG) pulses of which b values are mutually different.

13. A magnetic resonance imaging apparatus of claim 7, wherein said data acquisition unit is configured to set intensities of the plural phase-encoding gradient magnetic field pulses so as to cancel influences of respective eddy currents due to plural motion probing gradient (MPG) pulses of which application axes are mutually different.

14. A magnetic resonance imaging apparatus of claim 7, wherein said data acquisition unit is configured to set intensities of the plural phase-encoding gradient magnetic field pulses so as to cancel an influence of an eddy current due to only at least one motion probing gradient (MPG) pulse.

15. A magnetic resonance imaging apparatus of claim 7, wherein said data acquisition unit is configured to set intensities of the plural phase-encoding gradient magnetic field pulses so as to cancel influences of respective eddy currents clue to at least one motion probing gradient (MPG) pulse and at least one spoiler pulse.

16. A magnetic resonance imaging apparatus of claim 7, wherein said data acquisition unit is configured to set intensities of the plural phase-encoding gradient magnetic field pulses so as to cancel influences of respective eddy currents due to at least one motion probing gradient (MPG) pulse and at least one gradient magnetic field pulse applied at an elapsed time from application of a gradient magnetic field pulse as a correction target therefore.

17. A magnetic resonance imaging apparatus of claim 1, wherein said data acquisition unit is configured to set intensities of the plural phase-encoding gradient magnetic field pulses so as to cancel an influence of an eddy current due to at least one gradient magnetic field pulse applied at an elapsed time from an application of a gradient magnetic field pulse as a correction target therefore.

18. A magnetic resonance imaging apparatus of claim 1, wherein said data acquisition unit is configured to set intensities of the plural phase-encoding gradient magnetic field pulses with a recursive calculation so as to cancel an influence of an eddy current due to at least one gradient magnetic field pulse having been subjected to an intensity correction for cancelling an influence of an eddy current.

19. A magnetic resonance imaging apparatus of claim 1, wherein said data acquisition unit is configured to set intensities of the plural phase-encoding gradient magnetic field pulses without recursive calculation by assuming that an influence of an eddy current due to a gradient magnetic field pulse having been subjected to an intensity correction for cancelling an influence of an eddy current is equivalent to that due to a gradient magnetic field pulse before the intensity correction.

20. A magnetic resonance imaging apparatus of claim 1, wherein said data acquisition unit is configured to set intensities of the plural phase-encoding gradient magnetic field pulses so as to cancel influences of eddy currents spatially occurring in a same axis direction and a different axis direction as and from an application axis of at least one gradient magnetic field pulse due to the one gradient magnetic field pulse.

21. A magnetic resonance imaging (MRI) method comprising:

acquiring echo signals by echo planar imaging which generates the echo signals by applying plural phase-encoding gradient magnetic field pulses and by repeatedly inverting a readout gradient magnetic field after one nuclear magnetic resonance (NMR) excitation, the plural phase-encoding gradient magnetic field pulses each having an intensity set for each of plural spatial imaging positions so as to adaptively compensate an influence of spatially distributed eddy currents to each of the spatial imaging positions; and generating MRI data and an image based on the acquired echo signals.

* * * * *